United States Patent
Waki et al.

(10) Patent No.: US 8,004,435 B2
(45) Date of Patent: Aug. 23, 2011

(54) DISCRETE-TIME CIRCUIT

(75) Inventors: Naoya Waki, Kanagawa (JP); Hirotomo Ishii, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/612,821

(22) Filed: Nov. 5, 2009

(65) Prior Publication Data

US 2010/0207795 A1  Aug. 19, 2010

(30) Foreign Application Priority Data

Feb. 17, 2009  (JP) ................................. 2009-034331

(51) Int. Cl.
*H03M 1/00* (2006.01)
(52) U.S. Cl. ........................................ 341/122; 341/143
(58) Field of Classification Search .................. 341/122, 341/144, 143, 155, 172, 150
See application file for complete search history.

(56) References Cited

U.S. PATENT DOCUMENTS

| | | | | |
|---|---|---|---|---|
| 5,731,774 | A * | 3/1998 | Fujii et al. | 341/144 |
| 6,937,174 | B2 * | 8/2005 | Higashi et al. | 341/122 |
| 7,015,842 | B1 * | 3/2006 | Gupta et al. | 341/122 |
| 7,113,117 | B1 * | 9/2006 | Pentakota et al. | 341/123 |
| 7,132,965 | B2 * | 11/2006 | Gupta et al. | 341/122 |
| 7,733,252 | B2 * | 6/2010 | Nee et al. | 341/122 |

FOREIGN PATENT DOCUMENTS

JP  05-235761  9/1993

* cited by examiner

*Primary Examiner* — Peguy JeanPierre
(74) *Attorney, Agent, or Firm* — Turocy & Watson, LLP (57) ABSTRACT

To reduce a random noise power included in an analog input signal, a discrete-time circuit samples an inputted analog signal a plurality of number of times at different times respectively and performs averaging processing on sampling results, thus enabling to respond appropriately even if an input signal has a high frequency without increasing a size of the circuit.

17 Claims, 10 Drawing Sheets

ENLARGED VIEW OF
INVERTING INPUT TERMINAL

FIG.7

ENLARGED VIEW OF INVERTING INPUT TERMINAL

FIG.8

ENLARGED VIEW OF
INVERTING INPUT TERMINAL

APPLICATION EXAMPLE TO PIPELINE ADC

FIG.10B

APPLICATION EXAMPLE TO DELTA SIGMA ADC

DISCRETE-TIME CIRCUIT

CROSS-REFERENCE TO RELATED APPLICATIONS

This application is based upon and claims the benefit of priority from the prior Japanese Patent Application No. 2009-034331, filed on Feb. 17, 2009; the entire contents of which are incorporated herein by reference.

BACKGROUND OF THE INVENTION

1. Field of the Invention

The present invention relates to a discrete-time circuit.

2. Description of the Related Art

A discrete-time circuit includes a circuit that samples and captures an analog input signal in an input stage, and is, for example, an analog to digital converter (ADC), a sample & hold (S/H) circuit, a switched capacitor (SC) integrator, and the like.

With an increase in accuracy of the discrete-time circuit, the signal-to-noise (S/N) ratio of the discrete-time circuit becomes higher than that of a measuring device. In other words, the noise floor level of the discrete-time circuit becomes lower than that of the measuring device, so that a random noise exceeding the noise floor level of the discrete-time circuit may be inputted from the measuring device as a signal. Therefore, it becomes difficult to accurately measure the property of the discrete-time circuit. If a measuring device having a high SN ratio is used to avoid the above problem, the cost in the measuring system increases.

On the other hand, the discrete-time circuit itself has a problem in that a signal amplitude decreases due to the low voltage and the random noise power generated in the discrete-time circuit system becomes relatively high, and whereby the SN ratio deteriorates. Therefore, for example, in the configuration in which the discrete-time circuits are cascaded in multiple stages, the total noise power is a sum of contribution amounts of the noise power of the respective stages, which is extremely large. However, a current needs to be increased to lower the random noise power generated in the discrete-time circuit, which leads to increase in power consumption.

In the configuration in which the discrete-time circuits are cascaded in multiple stages, considering the influence of the random noise power generated in the discrete-time circuits, the discrete-time circuit of the front stage is a signal source of outputting the random noise with respect to the discrete-time circuit of the rear stage in the similar manner to the example of the measuring device.

In the present invention, a countermeasure is not taken to reduce the random noise power generated in the discrete-time circuit; however the discrete-time circuit is provided with a function to reduce the random noise power included in an analog input signal that is inputted to the discrete-time circuit to raise the SN ratio on the output side even if the SN ratio on the signal input side is not good. With this configuration, the SN ratio of the discrete-time circuit itself can be raised, and the above mentioned difficulty in evaluation performed by the measuring device can be eased.

For example, Japanese Patent Application Laid-open No. H05-235761 discloses a method in which analog input signals are sequentially sampled so that the sampling periods thereof do not overlap with each other by using a plurality of sampling clocks having a frequency higher than an operation control clock and the sampled values thereof are averaged to thereby reduce the random noise power included in the analog input signals.

However, in the above technology disclosed in Japanese Patent Application Laid-open No. H05-235761, because the analog input signals are sampled so that the sampling periods thereof do not overlap with each other, a settling error becomes large and a signal power degrades, and it becomes difficult to respond when the analog signal has a high frequency that changes greatly. Moreover, a circuit for generating a high-speed sampling clock is needed and a plurality of equivalent sampling capacitors is composed of independent components, so that the circuit becomes large and the power consumption increases.

SUMMARY OF THE INVENTION

According to one aspect of the present invention, a discrete-time circuit that samples an inputted analog signal a plurality of number of times at different times respectively and averages results of a plurality of samplings, the discrete-time circuit includes a plurality of sampling circuits that samples the analog signal by a plurality of sampling clocks of which sampling periods overlap with each other and which has a relationship in which end times of the sampling periods are different from each other, in a first half cycle in a sampling cycle that is same cycle as an operation control clock of the discrete-time circuit; and an averaging processing circuit that performs average processing on each sampled value in the sampling circuits in response to a start of a period corresponding to a last half cycle of the sampling period in the operation control clock.

BRIEF DESCRIPTION OF THE DRAWINGS

FIGS. 10A and 10B are configuration block diagrams illustrating examples of a multi-stage cascaded system of the discrete-time circuits to which the present invention is applied according to a ninth embodiment of the present invention, in which

DETAILED DESCRIPTION OF THE INVENTION

Exemplary embodiments of a discrete-time circuit according to the present invention are described in detail below with reference to the accompanying drawings. The present invention is not limited to the embodiments.

Figure 1:
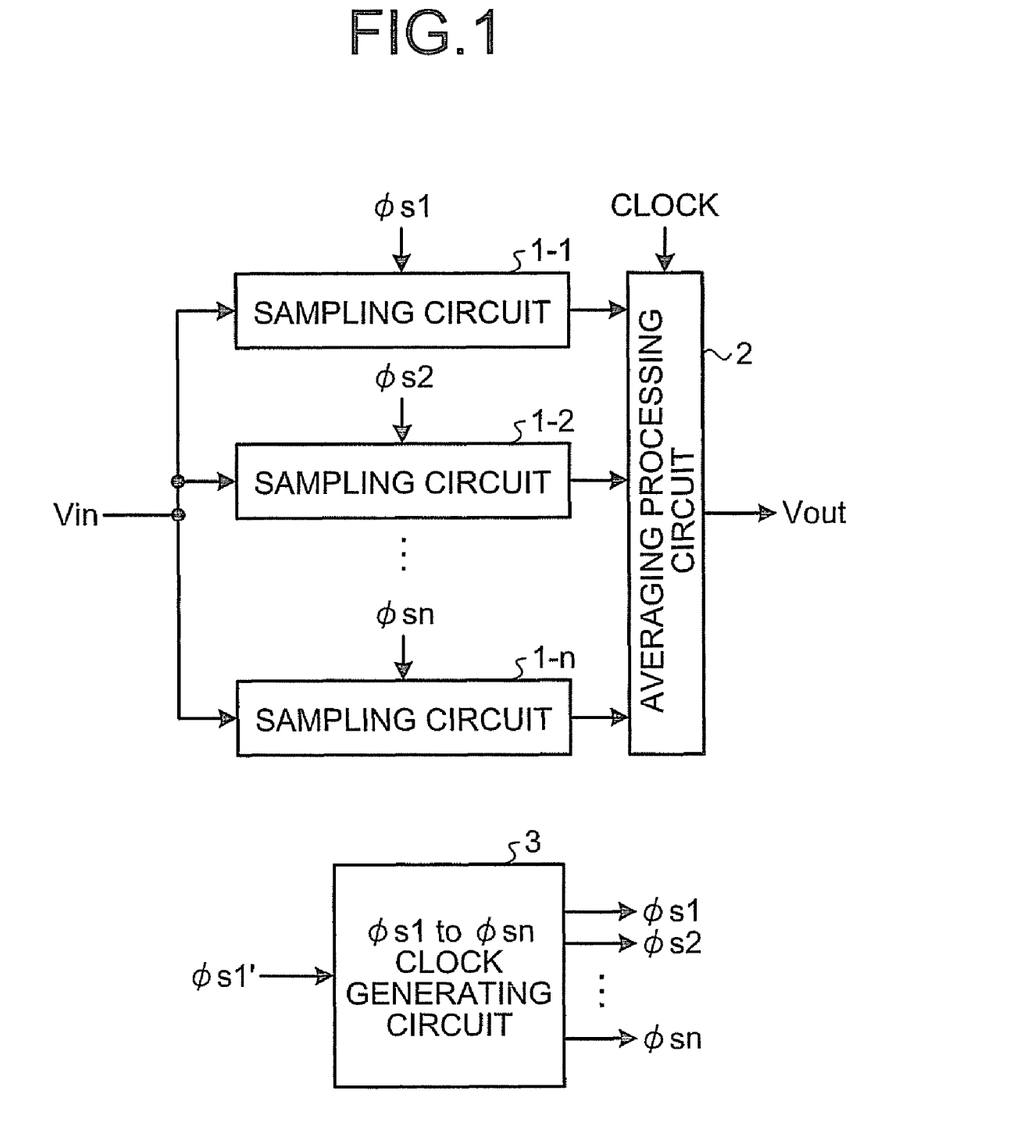
FIG. 1 is a block diagram illustrating a configuration a relevant portion of a discrete-time circuit according to a first embodiment of the present invention.

FIG. 1 is a block diagram illustrating a configuration a relevant portion of a discrete-time circuit according to a first embodiment of the present invention. The discrete-time circuit in the present invention is, for example, an ADC, an S/H circuit, or an SC integrator.

As shown in FIG. 1, in the present embodiment, the discrete-time circuit includes n (n≧2) number of sampling circuits 1-1 to 1-n to which an analog signal Vin is inputted in parallel and an averaging processing circuit 2 to which outputs (sampled values) of the sampling circuits 1-1 to 1-n are inputted, at the input stage as a circuit that samples and captures the analog signal Vin.

A $\phi s1$ to $\phi sn$ clock generating circuit 3 is provided at the input stage together with the above circuit elements or at a different position in the discrete-time circuit, for example, in a clock generating unit (not shown).

Figure 2:
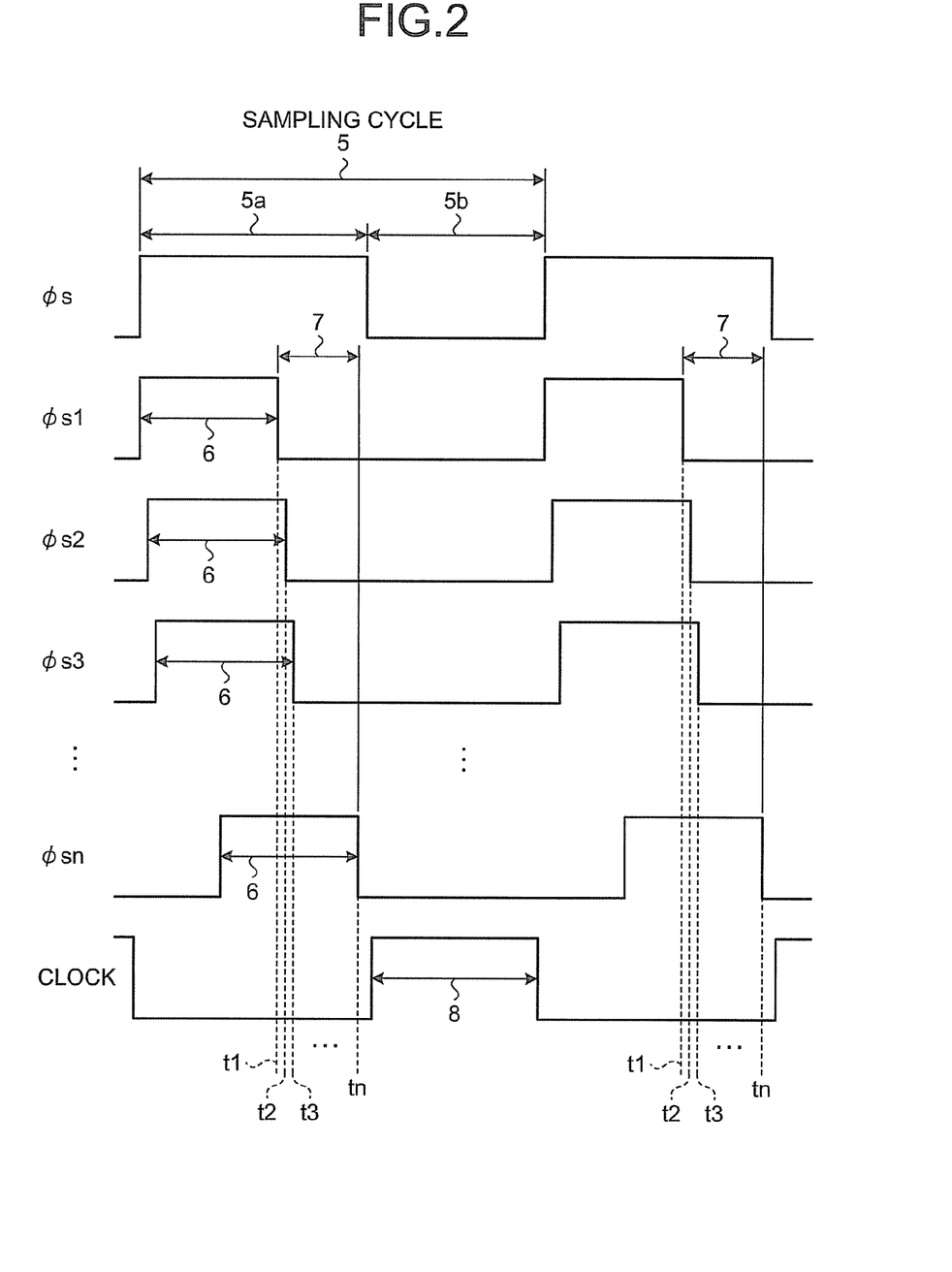
FIG. 2 is a timing chart for explaining an operation and the like of the configuration of the relevant portion shown in FIG. 1.

The clock generating unit is typically included in the discrete-time circuit and generates an operation control clock (see FIG. 2), a main sampling clock $\phi s$ (see FIG. 2), and a sub sampling clock $\phi s1'$ shown in FIG. 1 based on a basic master clock. As shown in FIG. 2, the main sampling clock $\phi s$ is a clock signal representing a waveform change that is obtained by logically inverting the operation control clock in the non-overlapping relationship. The sub sampling clock $\phi s1'$ (not shown in FIG. 2) is a clock signal that changes with the same logical status as the main sampling clock $\phi s$. The sub sampling clock $\phi s1'$ represents a waveform change that appears in the relationship to end earlier than the high level period of the main sampling clock $\phi s$ in the high level period of the main sampling clock $\phi s$.

Figure 9A:
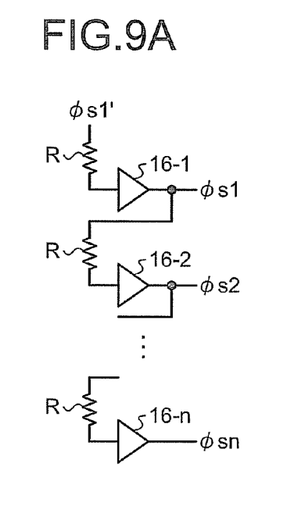
FIGS. 9A to 9C are circuit diagrams illustrating configuration examples of a sampling clock generating circuit shown in FIG. 1 according to an eighth embodiment of the present invention.
Figure 9B:
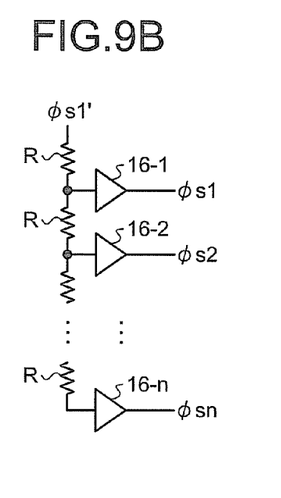
Figure 9C:
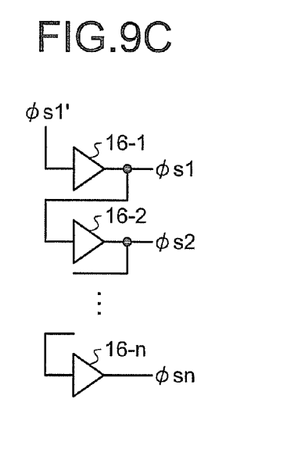

The $\phi s1$ to $\phi sn$ clock generating circuit 3 generates individual sampling clocks $\phi s1$ to $\phi sn$ (see FIG. 2) used in the respective sampling circuits 1-1 to 1-n, for example, with the configurations shown in FIGS. 9A to 9C, based on the sub sampling clock $\phi s1'$ outputted from the clock generating unit in the discrete-time circuit.

The sampling circuits 1-1 to 1-n sample the analog signal Vin inputted thereto in parallel in accordance with the individual sampling clocks $\phi s1$ to $\phi sn$ outputted from the $\phi s1$ to $\phi sn$ clock generating circuit 3 (see FIG. 2), respectively, and output the respective sampled values to the averaging processing circuit 2.

The averaging processing circuit 2 performs averaging processing on n number of the sampled values obtained by the sampling circuits 1-1 to 1-n in accordance with the operation control clock outputted from the clock generating unit (see FIG. 2) and outputs an analog signal Vout obtained by performing the averaging processing on the sampled values.

Next, an operation is explained with reference to FIG. 2. FIG. 2 is a timing chart for explaining the operation and the like of the configuration of the relevant portion shown in FIG. 1. In FIG. 2, the relationship between the operation control clock and the main sampling clock $\phi s$, the relationship between the main sampling clock $\phi s$ and the individual sampling clocks $\phi s1$ to $\phi sn$, and the relationship between the individual sampling clocks $\phi s1$ to $\phi sn$ are shown as an example.

In FIG. 2, the main sampling clock $\phi s$ is a clock signal that is obtained by logically inverting the operation control clock in the non-overlapping relationship. One cycle of the main sampling clock $\phi s$ is a sampling cycle 5. In an example shown in FIG. 2, a first half cycle 5a of the sampling cycle 5 is in high level and a last half cycle 5b of the sampling cycle 5 is in low level. The timing of the leading and trailing edges of the operation control clock is different from that of the main sampling clock $\phi s$, and a period corresponding to the first half cycle 5a is in low level and a period 8 corresponding to the last half cycle 5b is in high level.

In the first half cycle 5a that is the high level period of the main sampling clock $\phi s$, the sampling operation is performed by the sampling circuits 1-1 to 1-n. In the period 8 that is the high level period of the operation control clock, the averaging processing is performed in the averaging processing circuit 2.

The sub sampling clock $\phi s1'$ is a clock signal in which the end time (falling time to the low level) of the high level period is earlier than the end time of the first half cycle 5a in the period of the first half cycle 5a.

The individual sampling clocks $\phi s1$ to $\phi sn$ generated based on the sub sampling clock $\phi s1'$ each are a clock signal that includes a sampling period 6 in high level in the period of the first half cycle 5a and becomes a non-sampling period of an even low level in the period of the last half cycle 5b after the sampling period 6.

As shown in FIG. 2, the individual sampling clocks $\phi s1$ to $\phi sn$ are generated so that they have different start times and the sampling periods 6 thereof overlap each other. For easy understanding, the sampling period 6 is illustrated in the same length period in each sampling clock in FIG. 2; however, the length thereof is arbitrary so long as the sampling periods 6 present while overlapping with each other.

End times t1 to tn (falling times from the high level to the low level) of the sampling periods 6 are different from each other. The end time t1 of the sampling period 6 of the sampling clock $\phi s1$ is the earliest, and the end time tn of the sampling period 6 of the sampling clock $\phi sn$ is the latest. The end times of the sampling periods 6 of the other sampling clocks are arranged at appropriate intervals between the end times t1 and tn.

The sampling is performed by the sampling circuits 1-1 to 1-n in the first half cycle 5a, and the averaging processing is performed by the averaging processing circuit 2 in the period 8. The timing relationship thereof is as follows.

The end time (falling time from the high level to the low level) of the first half cycle 5a is later than the end time tn of the last sampling clock $\phi sn$, and the start time (rising time from the low level to the high level) of the period 8 is later than the end time of the first half cycle 5a and the end time tn of the sampling clock $\phi sn$. In this manner, the sampling period 6 of the last sampling clock φsn and the period 8 of the operation control clock that is the averaging processing period do not overlap with each other.

At this time, in the sampling operation performed in the first half cycle 5a, the individual sampling clocks φs1 to φsn need to have a relationship in which the start time of each sampling clock is earlier than the end times of the respective sampling clocks. For ensuring this relationship, a time difference 7 between the earliest end time t1 and the latest end time tn is set to be shorter than the shorter period of the high level period (the sampling period 6) and the low level period (non-sampling period) in the individual sampling clocks φs1 to φsn.

The sampling operation is performed as follows. In the sampling circuits 1-1 to 1-n, the analog signal Vin is applied to a capacitor (not shown) in the first half cycle 5a. In the sampling circuit 1-1, signal charges of the analog signal Vin in the sampling period 6 of the sampling clock φs1 are accumulated in the capacitor, and the value (sampled value) at the end time t1 in the sampling period 6 is outputted to the averaging processing circuit 2. Thereafter, the same operation is performed sequentially until the last sampling circuit 1-n.

In the sampling operation process, because the sampling periods 6 of the individual sampling clocks φs1 to φsn overlap with each other, degradation of the signal power is low, and the change of the analog signal Vin can be reflected on the sampled values even if the analog signal Vin has a high frequency that changes greatly.

The operation control clock corresponding to the last half cycle 5b responds to the start of the period 8, and n number of the sampled values inputted in parallel from the sampling circuits 1-1 to 1-n are subjected to the averaging processing in the averaging processing circuit 2.

In the above operation process, because the random noise is generated in each of the sampling circuits 1-1 to 1-n, the random noise to be generated is n times of the case of providing one sampling circuit. However, in the present embodiment, because the averaging processing is performed, the random noise power generated in the discrete-time circuit is the same level as the case of providing one sampling circuit.

On the other hand, the random noise included in the input analog signal Vin directly appears to the output side of the discrete-time circuit system when one sampling circuit is provided. However, in the present embodiment, the analog input signal Vin is sampled at n number of different times and the sampled values are subjected to the averaging processing, so that the random noise power that is inputted to the discrete-time circuit is reduced to 1/n to be inputted to the output side. Therefore, it is possible to ease difficulty in evaluation performed by a measuring device having a low SN ratio and the SN ratio of the discrete-time circuit itself can be improved.

In the present embodiment, the sampling circuits 1-1 to 1-n that sample the analog input signal Vin at a plurality of different times perform the sampling operation within the sampling periods that overlap with each other. Therefore, the settling error becomes small and degradation of the signal power decreases compared with the conventional case, enabling to respond appropriately even if the frequency of the input signal is high.

Moreover, in the present embodiment, because the frequencies of the individual sampling clocks φs1 to φsn used in the sampling circuits 1-1 to 1-n are generated based on the sub sampling clock φs1', the frequencies are the same as that of the main sampling clock φs, i.e., the operation control clock. Therefore, a circuit for generating a high-speed sampling clock is not needed, so that the size of the circuit and the power consumption can be reduced compared with the conventional case. Each element shown in FIG. 1 can be formed without increasing the size of the circuit.

Specific configuration examples of each element shown in FIG. 1 and application examples are explained below as an embodiment.

Figure 3:
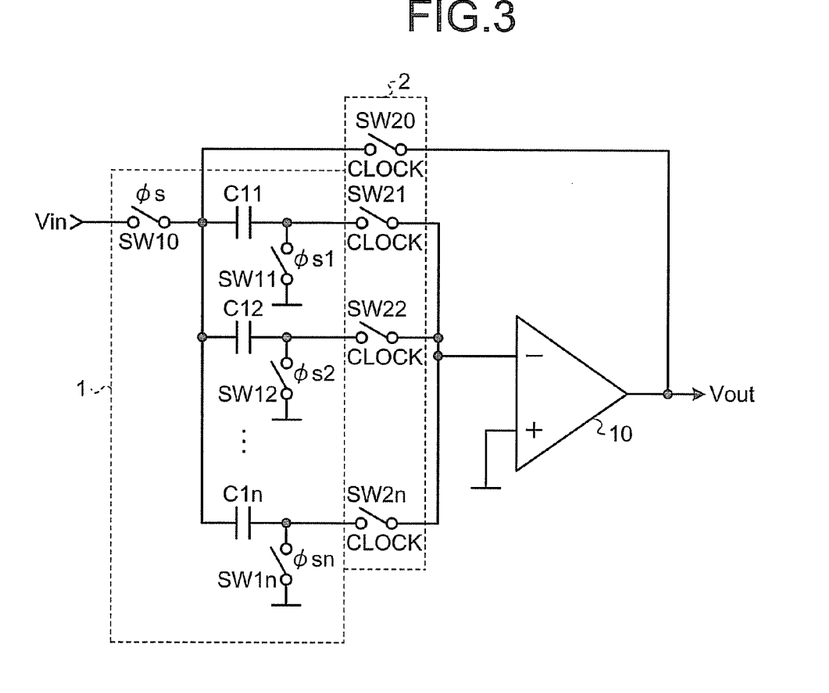
FIG. 3 is a circuit diagram illustrating an example of the configuration of the relevant portion shown in FIG. 1 when the discrete-time circuit is an S/H circuit according to a second embodiment of the present invention.

FIG. 3 is a circuit diagram illustrating an example of the configuration of the relevant portion shown in FIG. 1 when the discrete-time circuit is an S/H circuit according to a second embodiment of the present invention.

As a typical configuration example of the S/H circuit (first), a first switch, a capacitor, and a second switch are arranged in series in this order between an input terminal of the analog signal Vin and a circuit ground, a connection end of the capacitor and the second switch is connected to an inverting input terminal of an operational amplifier, and a connection end of the first switch and the capacitor is connected to an output terminal of the operational amplifier via the third switch. A non-inverting input terminal of the operational amplifier is connected to the circuit ground.

In the S/H circuit (first), the operation control clock, the main sampling clock φs, and the sub sampling clock φs1' explained in the first embodiment are used.

Specifically, in the S/H circuit (first), in the period of the first half cycle (corresponding to the first half cycle 5a shown in FIG. 2) of the operation control clock, the first and second switches are closed by the main sampling clock φs and the sub sampling clock φs1', respectively, and the third switch is opened by the operation control clock, so that signal charges of the analog signal Vin are accumulated in the capacitor. Next, in the period of the last half cycle (corresponding to the last half cycle 5b shown in FIG. 2) of the operation control clock, the first and second switches are opened by the main sampling clock φs and the sub sampling clock φs1', respectively, and the third switch is closed by the operation control clock, so that the both ends of the capacitor are connected between the inverting input terminal and the output terminal of the operational amplifier (negative feedback path) via the third switch, and the signal charges (sampled value) accumulated in the capacitor are outputted from the operational amplifier as a hold value.

FIG. 3 shows a configuration example in which the present invention is applied to the S/H circuit (first). In FIG. 3, a sampling circuit 1 includes a switch SW10 corresponding to the first switch, n number of capacitors C11 to C1n corresponding to the capacitor, and n number of switches SW11 to SW1n corresponding to the second switch.

Specifically, the sampling circuit 1 is configured such that a first sampling circuit (the sampling circuit 1-1 shown in FIG. 1) composed of a series circuit including the switch SW10, the capacitor C11, and the switch SW11, a second sampling circuit (the sampling circuit 1-2 shown in FIG. 1) composed of a series circuit including the switch SW10, the capacitor C12, and the switch SW12, . . . , and an n-th sampling circuit (the sampling circuit 1-n shown in FIG. 1) composed of a series circuit including the switch SW10, the capacitor C1n, and the switch SW1n are connected in parallel between the input terminal of the analog signal Vin and the circuit ground.

The switch SW10 performs a closing operation in the period of the first half cycle 5a in accordance with the main sampling clock φs shown in FIG. 2. The switches SW11 to SW1n perform a closing operation during the sampling periods 6 in accordance with the individual sampling clocks φs1 to φsn shown in FIG. 2, respectively. With this operation, the signal charges of the analog signal Vin are accumulated in the capacitors C11 to C1n, so that the signal charges of the capacitors C11 to C1n at the time when the switches SW11 to SW1n are opened at the end times t1 to tn of the individual sampling clocks φs1 to φsn, respectively, are obtained as the sampled values.

The capacitors C11 to C1n are divided capacitors obtained by dividing the capacitor in the S/H circuit (first) into n capacitors. If the capacity of the capacitor in the S/H circuit (first) is C, the capacity of each of the capacitors C11 to C1n is C/n. The switches SW11 to SW1n are obtained by dividing the second switch into n switches. Therefore, the circuit area of the sampling circuit 1 is the same as the sampling circuit in the S/H circuit (first), so that overhead does not occur.

The averaging processing circuit 2 includes a switch SW20 corresponding to the third switch and additional n number of switches SW21 to SW2n. The switches SW21 to SW2n are provided between respective connection ends of the capacitors C11 to C1n and the switches SW11 to SW1n and the inverting input terminal (−) of an operational amplifier 10. The switch SW20 and the switches SW21 to SW2n are all closed in response to the start of the average processing period (the period 8 corresponding to the last half cycle 5b in FIG. 2) of the operation control clock.

Thus, if the accumulated charges (sampled values) in the capacitors C11 to C1n are V1 to Vn, respectively, the average value Vout (=(V1+V2+ . . . +Vn)/n) is outputted from the output terminal of the operational amplifier 10.

In the averaging processing circuit 2 having such configuration, the overhead is more than the S/H circuit (first) for the circuit areas of the switches SW21 to SW2n. However, the switches SW21 to SW2n can be formed by dividing one switch as an independent component into n number of switches, so that the overhead can be reduced.

Figure 4:
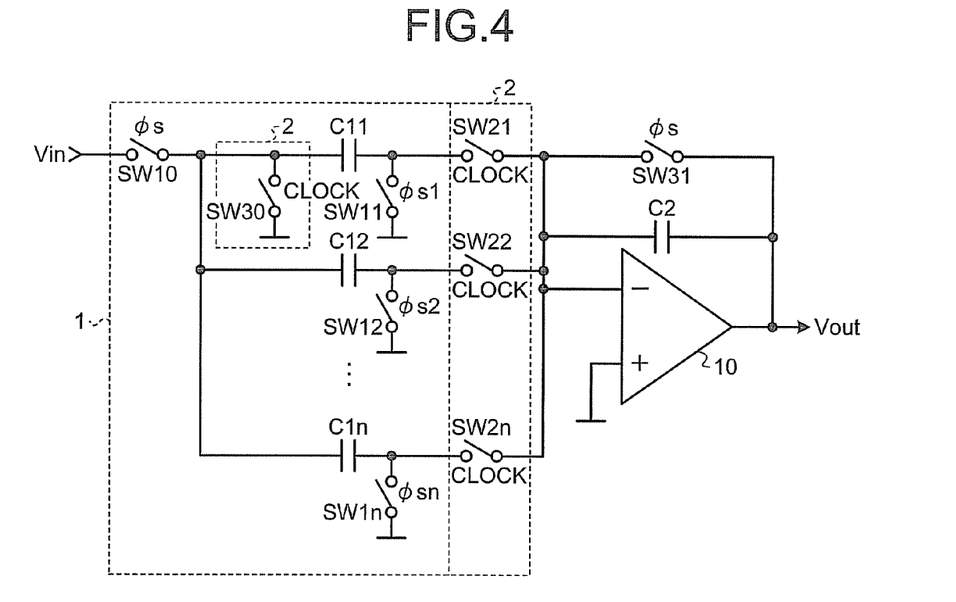
FIG. 4 is a circuit diagram illustrating another example of the configuration of the relevant portion shown in FIG. 1 when the discrete-time circuit is an S/H circuit according to a third embodiment of the present invention.

FIG. 4 is a circuit diagram illustrating another example of the configuration of the relevant portion shown in FIG. 1 when the discrete-time circuit is an S/H circuit according to a third embodiment of the present invention.

As a typical configuration example of the S/H circuit (second), a first switch, a first capacitor, and a second switch are arranged in series in this order between the input terminal of the analog signal Vin and the circuit ground, a third switch and a second capacitor are connected in parallel between the inverting input terminal and the output terminal of the operational amplifier, a connection end of the first capacitor and the second switch is connected to the inverting input terminal of the operational amplifier via a fourth switch, and a connection end of the first switch and the first capacitor is connected to the circuit ground via a fifth switch. The non-inverting input terminal of the operational amplifier is connected to the circuit ground.

In the S/H circuit (second) also, the operation control clock, the main sampling clock φs, and the sub sampling clock φs1' explained in the first embodiment are used.

Specifically, in the S/H circuit (second), in the period of the first half cycle (corresponding to the first half cycle 5a shown in FIG. 2) of the operation control clock, the first and third switches and the second switch are closed by the main sampling clock φs and the sub sampling clock φs1', respectively, and the fourth and fifth switches are opened by the operation control clock, so that the sampling operation of accumulating signal charges of the analog signal Vin in the first capacitor is performed. The second capacitor is discharged to reset. Next, in the period of the last half cycle (corresponding to the last half cycle 5b shown in FIG. 2) of the operation control clock, the first and third switches and the second switch are opened by the main sampling clock φs and the sub sampling clock φs1', respectively, and the fourth and fifth switches are closed by the operation control clock, so that the accumulated charges (sampled values) in the first capacitor are transferred to the second capacitor and are outputted from the operational amplifier as a hold value.

FIG. 4 shows a configuration example in which the present invention is applied to the S/H circuit (second). In FIG. 4, the sampling circuit 1 includes the switch SW10 corresponding to the first switch, n number of the capacitors C11 to C1n corresponding to the first capacitor, and n number of the switches SW11 to SW1n corresponding to the second switch. The configuration of the sampling circuit 1 is similar to that of the sampling circuit 1 shown in FIG. 3, so that the sampling operation is performed in the similar manner.

In the sampling circuit 1 shown in FIG. 4, in the similar manner to the sampling circuit 1 shown in FIG. 3, if the capacity of the first capacitor is C, the capacity of each of the capacitors C11 to C1n is C/n. The switches SW11 to SW1n are also obtained by dividing the second switch into n switches. Therefore, the circuit area of the sampling circuit 1 is the same as the sampling circuit in the above S/H circuit.

A switch SW31 corresponds to the third switch and the capacitor C2 corresponds to the second capacitor. In the similar manner to the switch SW10, the switch SW31 is closed in the period of the first half cycle 5a in accordance with the main sampling clock φs shown in FIG. 2 to reset the capacitor C2.

The averaging processing circuit 2 includes n number of the switches SW21 to SW2n corresponding to the fourth switch and a switch SW30 corresponding to the fifth switch. The switches SW21 to SW2n and the switch SW30 are all closed in response to the start of the average processing period (the period 8 corresponding to the last half cycle 5b in FIG. 2) of the operation control clock. In the similar manner to the second embodiment, the average value Vout (=(V1+V2+ . . . +Vn)/n) is outputted from the output terminal of the operational amplifier 10.

In the averaging processing circuit 2 having the configuration shown in FIG. 4, the switches SW21 to SW2n can be formed by dividing one switch as an independent component into n switches in the similar manner to the second embodiment (FIG. 3), so that the overhead can be reduced.

Figure 5:
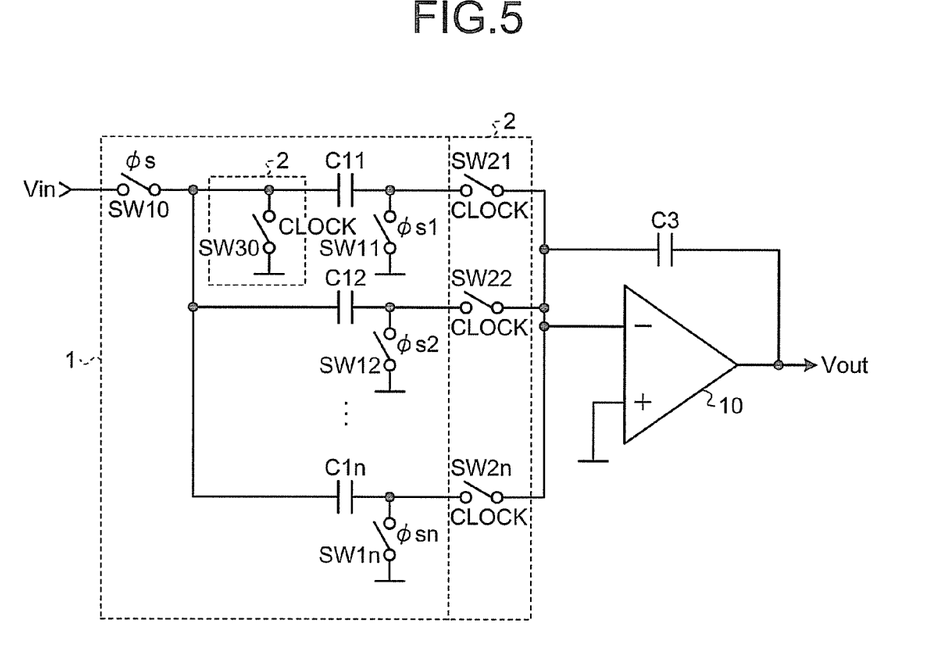
FIG. 5 is a circuit diagram illustrating an example of the configuration of the relevant portion shown in FIG. 1 when the discrete-time circuit is an SC integrator according to a fourth embodiment of the present invention.

FIG. 5 is a circuit diagram illustrating an example of the configuration of the relevant portion shown in FIG. 1 when the discrete-time circuit is an SC integrator according to a fourth embodiment of the present invention.

As a typical configuration example of the SC integrator, the third switch provided on the negative feedback path of the operational amplifier in the S/H circuit (second) in the third embodiment (FIG. 4) is removed.

The SC integrator is explained with identification signs shown in FIG. 4. In the first half cycle (corresponding to the first half cycle 5a shown in FIG. 2) of the operation control clock, the first and second switches are closed by the main sampling clock φs and the sub sampling clock φs1', respectively, and the fourth and fifth switches are opened by the operation control clock, so that the sampling operation of accumulating signal charges of the analog signal Vin in the first capacitor is performed. Next, in the period of the last half cycle (corresponding to the last half cycle 5b shown in FIG. 2) of the operation control clock, the first and second switches are opened by the main sampling clock φs and the sub sampling clock φs1', respectively, and the fourth and fifth switches are closed by the operation control clock, so that the accumulated charges (sampled value) in the first capacitor are transferred to the second capacitor to be accumulated (integrated) in the second capacitor and are outputted from the operational amplifier as an integration value. The output Vout of the SC integrator is expressed by the following equation:

$$Vout = \{z^{-1}/(1-z^{-1})\} \times Vin$$

FIG. 5 shows a configuration example in which the present invention is applied to the SC integrator. As shown in FIG. 5, the SC integrator according to the fourth embodiment has a configuration in which the switch SW31 is removed from the configuration shown in FIG. 4. In FIG. 5, the reference numeral of the capacitor present on the negative feedback path of the operational amplifier 10 is changed from "C2" to "C3".

The SC integrator in the fourth embodiment performs the integral operation and the averaging processing operation in parallel in response to the start of the average processing period (the period 8 corresponding to the last half cycle 5b in FIG. 2) of the operation control clock. The output Vout of the SC integrator in the fourth embodiment is expressed by the following equation:

$$Vout = \{z^{-1}/(1-z^{-1})\} \times \{(V1(z)+V2(z)+\ldots+Vn(z)/n\}$$

Figure 6:
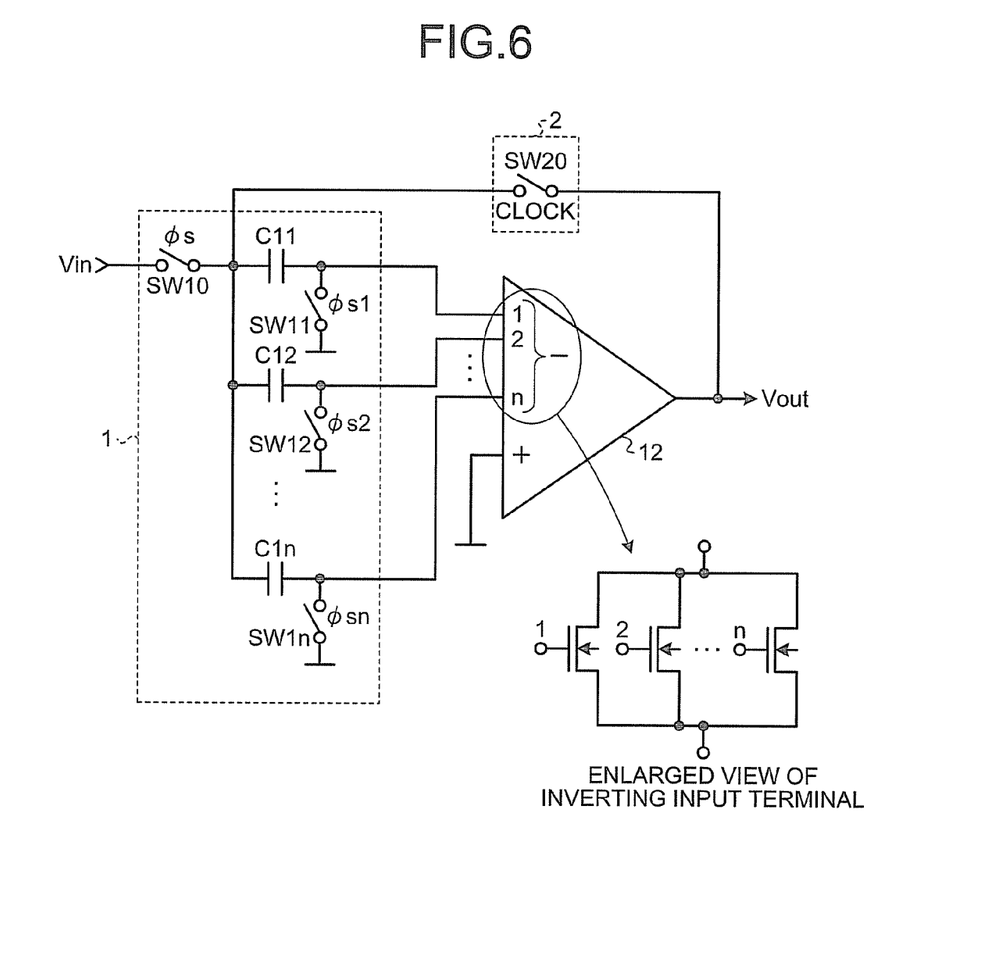
FIG. 6 is a circuit diagram illustrating still another example of the configuration of the relevant portion shown in FIG. 1 when the discrete-time circuit is an S/H circuit according to a fifth embodiment of the present invention.

FIG. 6 is a circuit diagram illustrating still another example of the configuration of the relevant portion shown in FIG. 1 when the discrete-time circuit is an S/H circuit according to a fifth embodiment of the present invention. In FIG. 6, another configuration example of the averaging processing circuit 2 is shown in the application example to the S/H circuit (first) shown in FIG. 3.

Specifically, in FIG. 6, the switches SW21 to SW2n are removed from the configuration shown in FIG. 3 and the operational amplifier of which reference numeral is changed to "12" is provided. An operational amplifier 12 has a configuration in which the inverting input terminal (−) is divided into n terminals. Specifically, as shown in an enlarged view in FIG. 6, a metal-oxide-semiconductor (MOS) transistor composing the inverting input terminal (−) is composed of a parallel circuit of n number of MOS transistors having the same channel length that is obtained by dividing the channel width into n channel widths. Then, n number of the sampled values from the sampling circuit 1 are directly inputted to the corresponding n-divided inverting input terminals (−). Therefore, the averaging processing circuit 2 includes the operational amplifier 12 and the switch SW20.

In this manner, with the configuration in which the switches SW21 to SW2n are removed and n number of the sampled values are directly inputted to the corresponding n-divided inverting input terminals (−), charge injection by the MOS switch (the switches SW21 to SW2n) for input to the operational amplifier can be reduced. Moreover, because the switches SW21 to SW2n, which are needed in FIG. 3, are not needed, the S/H circuit can be realized with less overhead compared with the S/H circuit (first).

Figure 7:
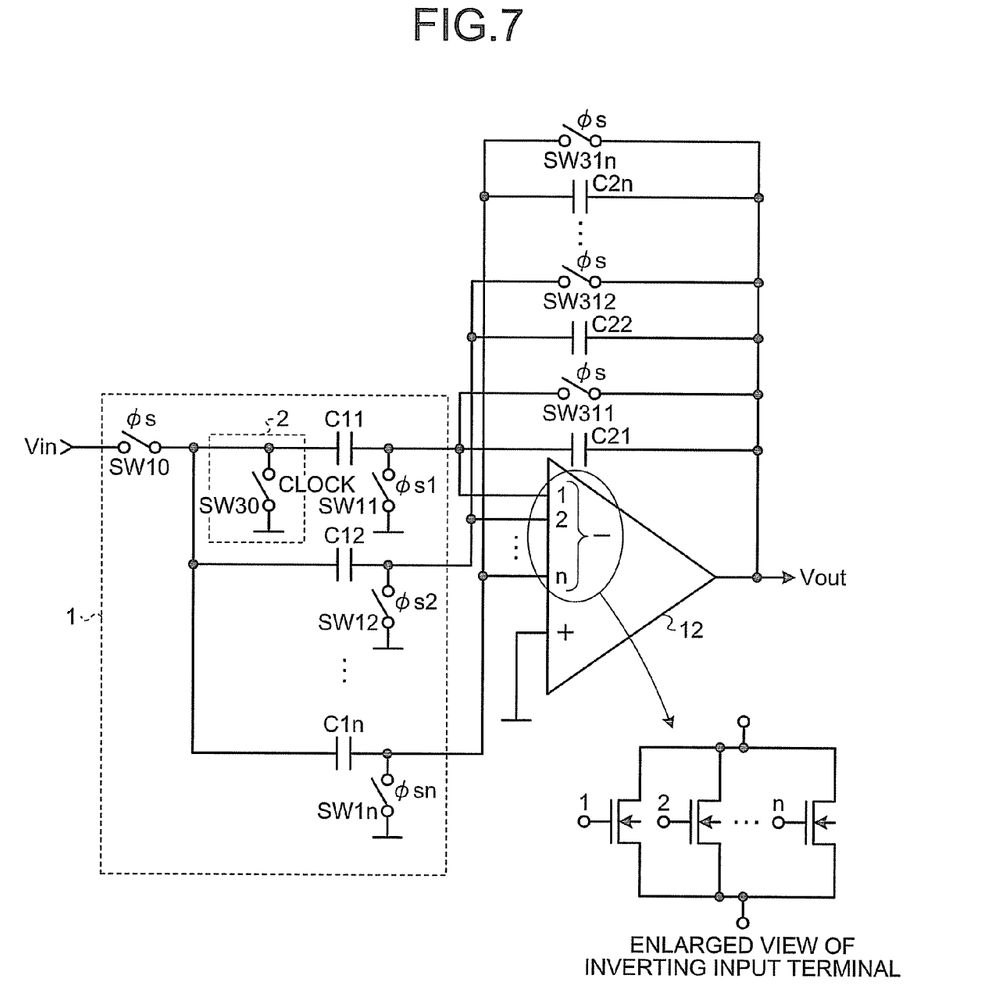
FIG. 7 is a circuit diagram illustrating still another example of the configuration of the relevant portion shown in FIG. 1 when the discrete-time circuit is an S/H circuit according to a sixth embodiment of the present invention.

FIG. 7 is a circuit diagram illustrating still another example of the configuration of the relevant portion shown in FIG. 1 when the discrete-time circuit is an S/H circuit according to a sixth embodiment of the present invention. In FIG. 7, another configuration example of the averaging processing circuit 2 is shown in the application example to the S/H circuit (second) shown in FIG. 4.

Specifically, in FIG. 7, the switches SW21 to SW2n are removed from the configuration shown in FIG. 4 and the operational amplifier of which reference numeral is changed to "12" is provided. The operational amplifier 12 has a configuration in which the inverting input terminal (−) is divided into n terminals by the method explained with reference to FIG. 6. In the similar manner to the case shown in FIG. 6, n number of the sampled values sampled by the sampling circuit 1 are directly inputted to the corresponding n-divided inverting input terminals (−). Therefore, the averaging processing circuit 2 includes the operational amplifier 12 and the switch SW30. With this configuration, the charge injection can be reduced in the similar manner to the case shown in FIG. 6 (fifth embodiment).

In FIG. 7, in the configuration shown in FIG. 4, the parallel circuit of the capacitor C2 and the switch SW31 provided on the negative feedback path of the operational amplifier 10 is divided into n number of parallel circuits of a parallel circuit of a capacitor C21 and a switch SW311, ..., and a parallel circuit of a capacitor C2n and a switch SW31n to be provided for the respective n-divided inverting input terminals (−) of the operational amplifier 12. Therefore, the overhead of the circuit can be reduced. Moreover, because the switches SW21 to SW2n, which are needed in FIG. 4, are not needed, the S/H circuit can be realized with less overhead compared with the S/H circuit (second).

Figure 8:
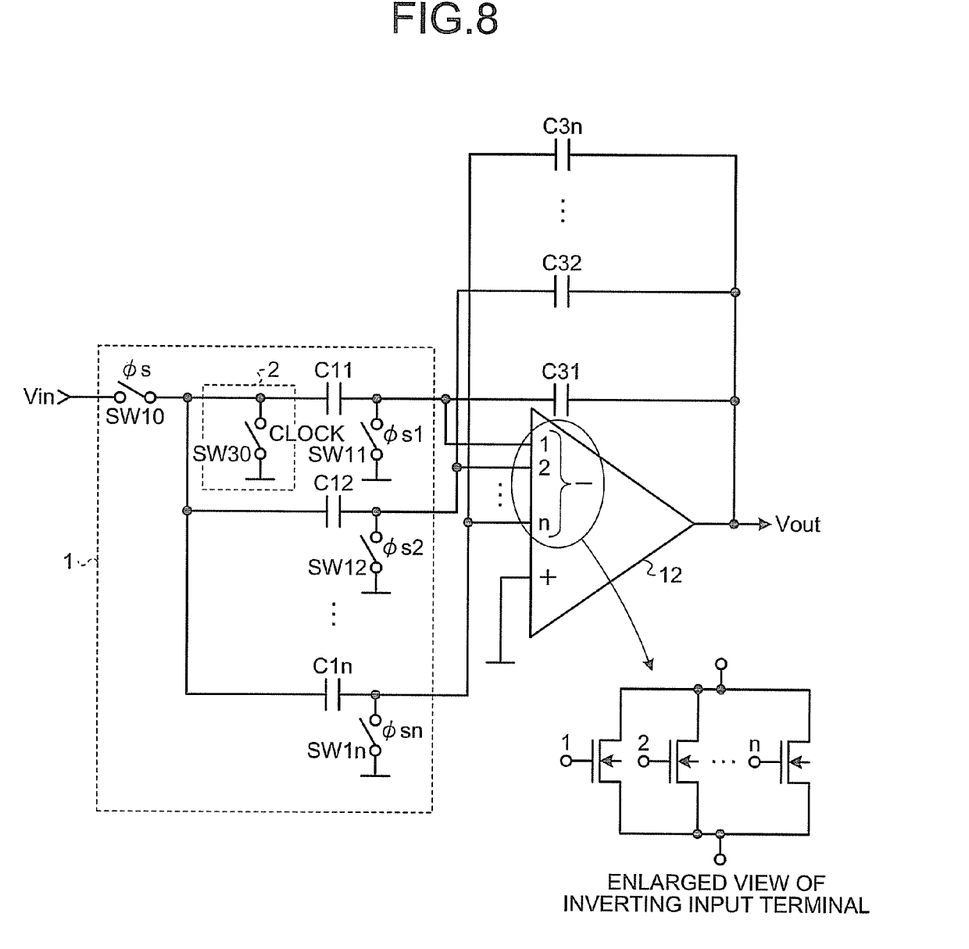
FIG. 8 is a circuit diagram illustrating another example of the configuration of the relevant portion shown in FIG. 1 when the discrete-time circuit is an SC integrator according to a seventh embodiment of the present invention.

FIG. 8 is a circuit diagram illustrating another example of the configuration of the relevant portion shown in FIG. 1 when the discrete-time circuit is an SC integrator according to a seventh embodiment of the present invention. In FIG. 8, another configuration example of the averaging processing circuit 2 is shown in the application example to the SC integrator shown in FIG. 5.

Specifically, in FIG. 8, the switches SW21 to SW2n are removed from the configuration shown in FIG. 5 and the operational amplifier of which reference numeral is changed to "12" is provided. The operational amplifier 12 has a configuration in which the inverting input terminal (−) is divided into n terminals by the method explained with reference to FIG. 6. In the similar manner to the case shown in FIG. 6, n number of the sampled values sampled by the sampling circuit 1 are directly inputted to the corresponding n-divided inverting input terminals (−). Therefore, the averaging processing circuit 2 includes the operational amplifier 12 and the switch SW30 in the similar manner to the case shown in FIG. 7 (sixth embodiment). With this configuration, the charge injection can be reduced in the similar manner to the case shown in FIG. 6 (fifth embodiment).

In FIG. 8, in the configuration shown in FIG. 5, the capacitor C3 provided on the negative feedback path of the operational amplifier 10 is divided into capacitors C31 to C3n to be provided for the respective n-divided inverting input terminals (−) of the operational amplifier 12. Therefore, the overhead of the circuit can be reduced. Moreover, because the switches SW21 to SW2n, which are needed in FIG. 5, are not needed, the SC integrator can be realized with less overhead compared with the above conventional SC integrator.

FIGS. 9A to 9C are circuit diagrams illustrating configuration examples of the φs1 to φsn sampling clock generating circuit 3 shown in FIG. 1 according to an eighth embodiment of the present invention.

If the φs1 to φsn sampling clock generating circuit 3 is configured using the conventional technology, a plurality of buffers are connected in series, the sub sampling clock φs1' is inputted to one end of the series circuit, and a corresponding plurality of the individual sampling clocks φs1 to φsn are retrieved from the respective buffers. With the configuration in which a plurality of buffers as independent components is arranged, the circuit area becomes large and the overhead of the circuit occurs, which is not preferable.

Therefore, focusing on using the switch SW11 to SW1n obtained by dividing a switch into n switches in FIG. 3 (second embodiment) to FIG. 8 (seventh embodiment), in the present embodiment, the φs1 to φsn sampling clock generating circuit 3 shown in FIG. 1 is composed of n number of divided buffers 16-1 to 16-n obtained by dividing a buffer as an independent component into n buffers as shown in FIGS. 9A to 9C.

The divided buffers 16-1 to 16-n output the individual sampling clocks φs1 to φsn, respectively, based on the sub sampling clock φs1'.

In FIG. 9A, the input terminal of the divided buffer 16-1 is connected to the input terminal of the sub sampling clock φs1' via a line having a resistance R, and thereafter the input-output terminals of the divided buffers 16-1 to 16-n are connected with each other with lines having the resistance R. In FIG. 9B, the line connected to the input terminal of the sub sampling clock φs1' is divided into n sections for each resistance R, and the input terminal of each of the divided buffers 16-1 to 16-n is connected to a corresponding divided position. In FIG. 9C, the divided buffers 16-1 to 16-n are connected in series to the input terminal of the sub sampling clock φs1'.

With the configurations shown in FIGS. 9A and 9B, the individual sampling clocks φs1 to φsn can be obtained from the divided buffers 16-1 to 16-n to have a relationship explained in FIG. 2 based on the sub sampling clock φs1' by adjusting the size of the divided buffers 16-1 to 16-n and the resistance R of the line. With the configuration shown in FIG. 9C, the individual sampling clocks φs1 to φsn can be obtained from the divided buffers 16-1 to 16-n to have a relationship explained in FIG. 2 based on the sub sampling clock φs1' by adjusting the size of the divided buffers 16-1 to 16-n.

According to the eighth embodiment, the φs1 to φsn sampling clock generating circuit 3 shown in FIG. 1 can be configured with less circuit overhead.

In FIG. 3 (second embodiment) to FIG. 8 (seventh embodiment), the sampling circuit 1 uses the main sampling clock φs not shown in FIG. 1 for showing the circuit corresponding to the configurations of the conventional circuits (the S/H circuits (first) (second) and the SC integrator). However, the sampling circuit 1 can be configured without using the main sampling clock φs. Specifically, in the present invention, the switch SW10 can be divided into n switches in the similar manner to the switches SW11 to SW1n, and each divided switch can be controlled to open and close by a corresponding one of the individual sampling clocks φs1 to φsn instead of the main sampling clock φs.

If the switch SW10 is divided into n switches of the switches SW101 to SW10n, the sampling circuit 1 can be configured such that a first sampling circuit (the sampling circuit 1-1 shown in FIG. 1) composed of a series circuit including the switch SW101, the capacitor C11, and the switch SW11, a second sampling circuit (the sampling circuit 1-2 shown in FIG. 1) composed of a series circuit including the switch SW102, the capacitor C12, and the switch SW12, . . . , and an n-th sampling circuit (the sampling circuit 1-n shown in FIG. 1) composed of a series circuit including the switch SW10n, the capacitor C1n, and the switch SW1n are connected in parallel between the input terminal of the analog signal Vin and the circuit ground.

The main sampling clock φs is used in the conventional circuit (the S/H circuits (first) (second) and the SC integrator) for reducing the charge injection. The present invention aims to reduce the noise of the analog input signal and an object of the present invention does not relate to a countermeasure against the charge injection. However, this technology is conventionally used in general and therefore is shown as a conventional example for easily understanding of the present invention.

In the sampling circuit 1 shown in FIG. 3 (second embodiment) to FIG. 8 (seventh embodiment), the sampling operation performed when the main sampling clock φs is in high level and, for example, the sampling clock φsn is in high level is the same as controlling the sampling operation by the sampling clock φsn.

In other words, even if the sampling operation is changed from the control by the main sampling clock φs and the sampling clock φsn to the control only by the sampling clock φsn, the sampling operation does not change for the other points. Therefore, the sampling operation is not adversely affected. Thus, because the sampling circuit 1 can be configured without using the main sampling clock φs as described above, the main sampling clock φs is not needed in FIG. 1.

Figure 10A:
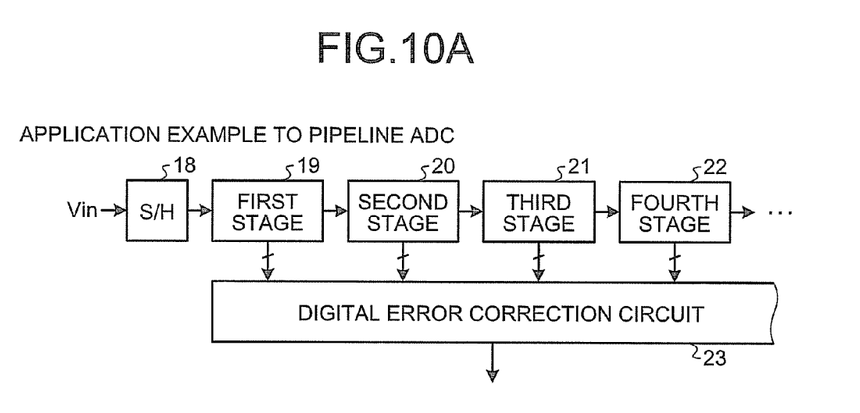
FIG. 10A is a configuration block diagram of a pipeline ADC.
Figure 10B:
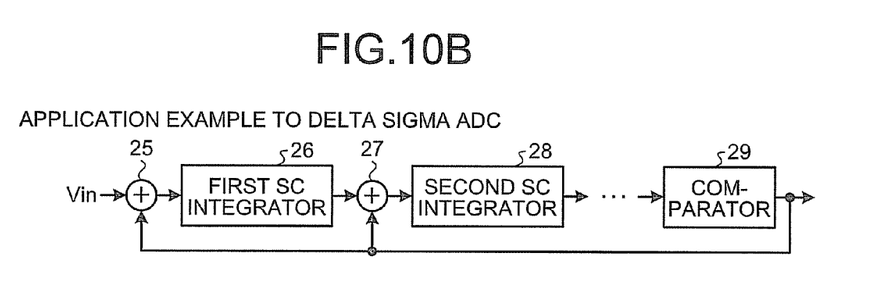
FIG. 10B is a configuration block diagram of a delta sigma ADC.

FIGS. 10A and 10B are configuration block diagrams illustrating examples of a multi-stage cascaded system of the discrete-time circuits to which the present invention is applied according to a ninth embodiment of the present invention, in which FIG. 10A is a configuration block diagram of a pipeline ADC, and FIG. 10B is a configuration block diagram of a delta sigma ADC.

The present invention can be applied to a sampling circuit included in arbitrary one or a plurality of stages of the multi-stage cascaded system of the discrete-time circuits to reduce the random noise power inputted to the applied stage to 1/n. Therefore, for example, if the present invention is applied to the first stage, difficulty in evaluation performed by a measuring device having a low SN ratio can be eased. If the present invention is applied to the M-th (M≧2) stage, the random noise power to be inputted from a previous stage can be reduced to 1/n in the applied stage, so that the SN ratio of the applied stage can be improved.

As the multi-stage cascaded system of the discrete-time circuits, there are a system in which switched capacitor filters are cascaded in multiple stages and the like other than the pipeline ADC and the delta sigma ADC; however, applications are shown taking the pipeline ADC and the delta sigma ADC as examples.

(1) Application Example to Pipeline ADC

In the pipeline ADC, an S/H circuit 18 is arranged in the first step, and a plurality of stages 19, 20, 21, 22, . . . that judges a logical value in order from the highest-order bit toward the lower bit is arranged in the second and subsequent steps. The results of judgment in the stages 19, 20, 21, 22, . . . are outputted outside through a digital error correction circuit 23.

The present invention can be applied to the sampling circuit included in arbitrary one or more stages in the second and subsequent steps in addition to the S/H circuit 18 in the first step of the pipeline ADC. For example, if the present invention is applied to the sampling circuit included in the first stage 19, the first stage 19 to which the present invention is applied can reduce the random noise power inputted from the S/H circuit 18 to 1/n.

(2) Application Example to Delta Sigma ADC

In the delta sigma ADC, adders and SC integrators are arranged alternately, the analog signal Vin and a feedback value are summed up in an adder 25 in the first step to generate an error difference, the error difference is integrated in a first SC integrator 26, the output from the first SC integrator 26 and a feedback value are summed up in an adder 27 in the second step to generate an error difference, and the error difference is integrated in a second SC integrator 28, which are repeated in multiple stages. The feedback value is generated in a comparator 29 provided in the last step.

The present invention can be applied to the sampling circuit included in the SC integrator in arbitrary one or more stages of the delta sigma ADC. For example, if the present invention is applied to the sampling circuit included in the second SC integrator 28, the second SC integrator 28 to which the present invention is applied can reduce the random noise power inputted from the adder 27 to 1/n.

Figure 11:
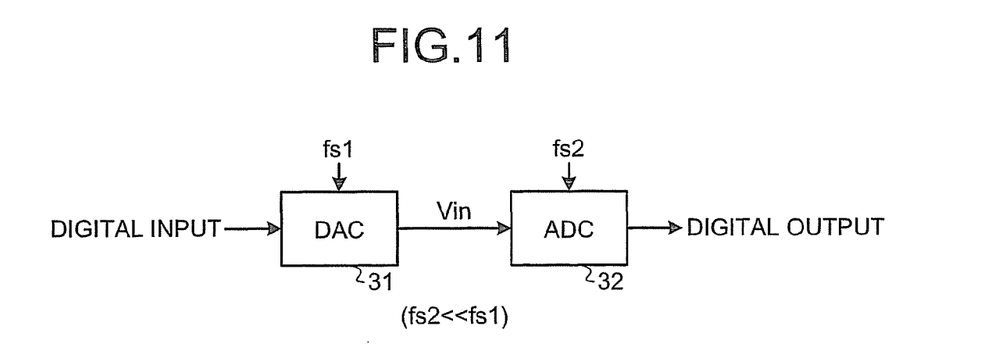
FIG. 11 is a configuration block diagram for explaining an application example to a system in which a DAC and an ADC are cascaded according to a tenth embodiment of the present invention.
Figure 12:
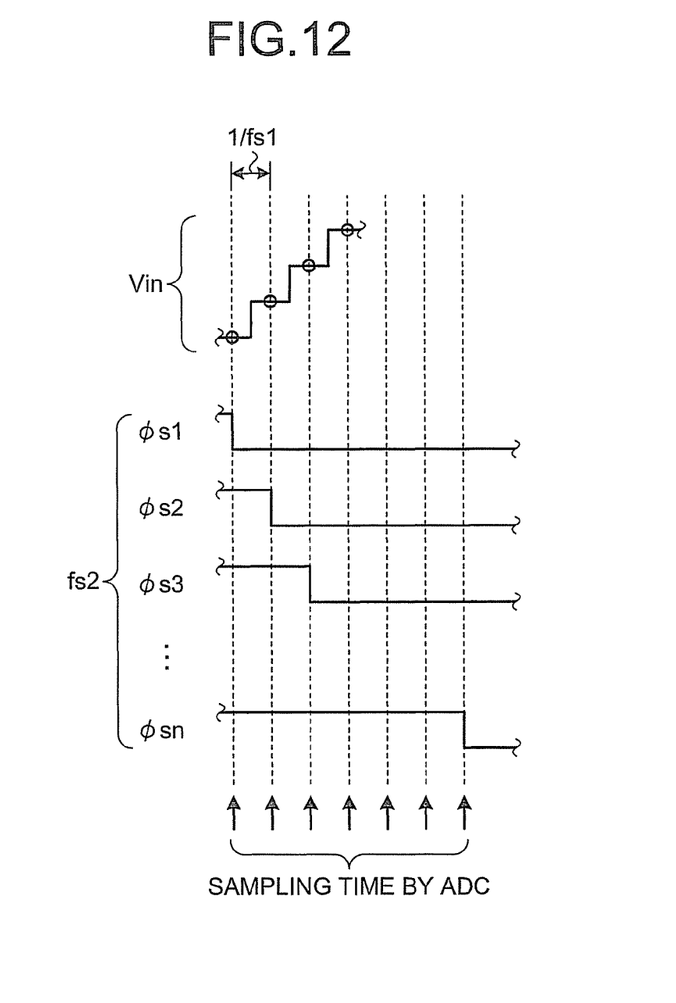
FIG. 12 is a timing chart for explaining a relationship between a conversion cycle of the DAC and sampling times of the ADC.

FIG. 11 is a configuration block diagram for explaining an application example to the system in which a DAC and an ADC are cascaded according to a tenth embodiment of the present invention. FIG. 12 is a timing chart for explaining a relationship between the conversion cycle of the DAC and the sampling times of the ADC.

In FIG. 11, in the system in which an input digital signal is converted into the analog signal Vin in a DAC 31 and the analog signal Vin is converted into a digital signal in an ADC 32 to be outputted, a sampling frequency fs1 of the DAC 31 is set to oversampling with respect to a sampling frequency fs2 of the ADC 32 (fs2<<fs1) so that the interval of the sampling times of the individual sampling clocks φs1 to φsn of the ADC 32 is synchronized with the sampling frequency fs1.

With this setting, as shown in FIG. 12, the sampling times of the individual sampling clocks φs1 to φsn become near the center of a sampling cycle 1/fs1 of the DAC 31 in the ADC 32, so that the quantization noise (random noise) in each conversion step of the DAC 31 can be picked out, thereby enabling to reduce the quantization noise (random noise) power to 1/n.

Figure 13:
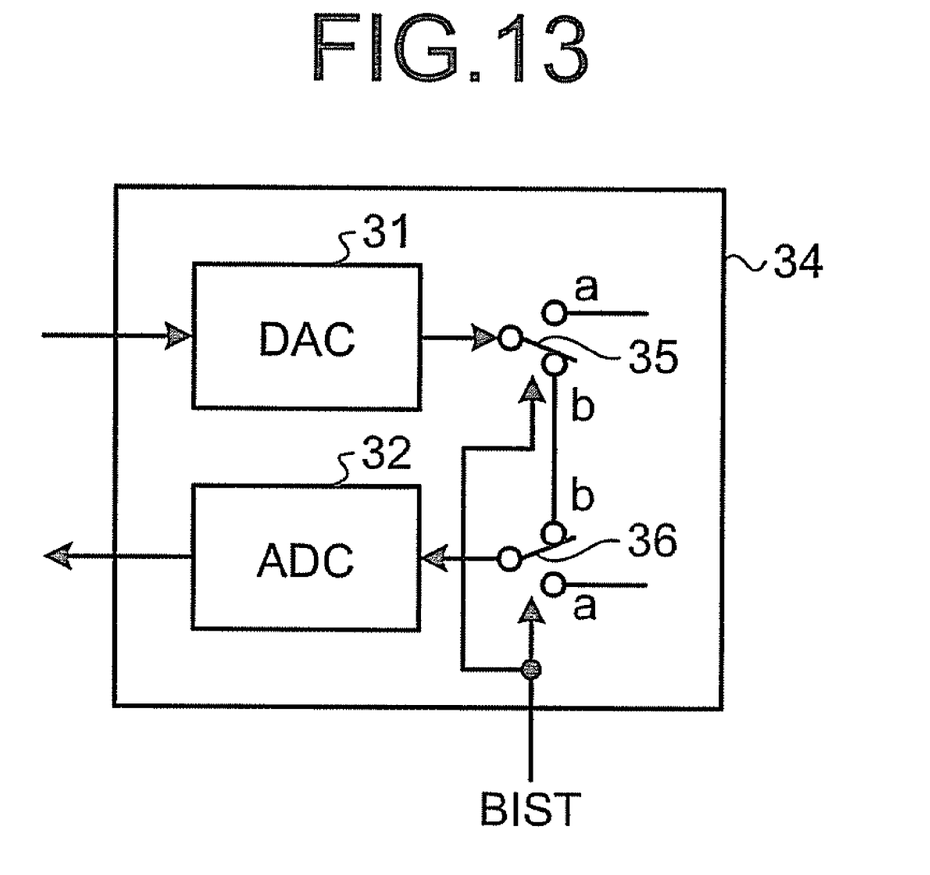
FIG. 13 is a configuration block diagram for explaining an application example to a built-in self-test (BIST) when the DAC and the ADC are integrated into an integrated circuit (IC) chip.

FIG. 13 is a configuration block diagram for explaining an application example to a BIST when the DAC and the ADC are integrated into an IC chip.

In FIG. 13, when the DAC 31 and the ADC 32 are integrated into an IC chip 34 as individual independent signal systems, a switch 35 is provided on an output route of the DAC 31, a switch 36 is provided on an input route of the ADC 32, and the switches 35 and 36 can switch a signal route between a normal route "a" side and a route "b" side for the BIST based on the presence or absence of input of a BIST instruction from outside.

When performing the BIST, the sampling frequencies fs1 and fs2 of the DAC 31 and the ADC 32 are set to the content (fs2<<fs1) explained in the tenth embodiment so that the conversion cycle of the DAC 31 and the sampling times of the ADC 32 have a relationship shown in FIG. 12. Moreover, the BIST instruction is given to switch the switches 35 and 36 to the route "b" side for the BIST, and a measuring signal outputted from a measuring device (not shown) is inputted to the ADC 32 via the DAC 31.

Then, the ADC 32 captures the output signal of the DAC 31 while reducing the quantization noise power included in the output signal to 1/n and performs signal output under the original SN ratio of the ADC 32. Thus, even if the SN ratio of a measuring device is not high, if the SN ratio of the DAC 31 is known, the property of the ADC 32 of which SN ratio is unknown can be evaluated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A discrete-time circuit that samples an inputted analog signal a plurality of number of times at different times respectively and averages results of a plurality of samplings, the discrete-time circuit comprising:
    a plurality of sampling circuits that samples the analog signal by a plurality of sampling clocks of which sampling periods overlap with each other and which has a relationship in which end times of the sampling periods are different from each other, in a first half cycle in a sampling cycle that is same cycle as an operation control clock of the discrete-time circuit; and
    an averaging processing circuit that performs average processing on each sampled value in the sampling circuits in response to a start of a period corresponding to a last half cycle of the sampling period in the operation control clock,
    wherein the averaging processing circuit includes an operational amplifier that includes a plurality of divided inverting input terminals that is connected to capacitors included in the sampling circuits, respectively, in one-to-one correspondence.

2. The discrete-time circuit according to claim 1, wherein a first sampling clock of which end time of a sampling period is earliest and a second sampling clock of which end time of a sampling period is latest out of the sampling clocks have a relationship in which a time difference between end times of the first sampling clock and the second sampling clock is shorter than a shorter one of a sampling period and a non-sampling period of the sampling clocks.

3. The discrete-time circuit according to claim 1, wherein capacitors included in the sampling circuits, respectively, are divided capacitors obtained by dividing a capacitor in a case of providing one sampling circuit into a plurality of capacitors.

4. The discrete-time circuit according to claim 1, wherein
    capacitors included in the sampling circuits, respectively, are divided capacitors obtained by dividing a capacitor in a case of providing one sampling circuit into a plurality of capacitors, and
    a plurality of switches provided between output terminals of the divided capacitors and a circuit ground is divided switches obtained by dividing one switch into a plurality of switches.

5. The discrete-time circuit according to claim 1, wherein
    capacitors included in the sampling circuits, respectively, are divided capacitors obtained by dividing a capacitor in a case of providing one sampling circuit into a plurality of capacitors, and
    a switch provided between input terminals of the divided capacitors and an input terminal of the analog signal is any one of one switch and divided switches obtained by dividing the one switch into a plurality of switches.

6. The discrete-time circuit according to claim 1, wherein the averaging processing circuit includes divided switches that are connected to capacitors included in the sampling circuits, respectively, in one-to-one correspondence and are obtained by dividing one switch into a plurality of switches.

7. The discrete-time circuit according to claim 1, wherein
    the averaging processing circuit includes an operational amplifier that includes a plurality of divided inverting input terminals that is connected to capacitors included in the sampling circuits, respectively, in one-to-one correspondence, and
    a parallel circuit that includes a switch and a capacitor and that is provided between the divided inverting input terminals and an output terminal of the operational amplifier is a plurality of parallel circuits that include divided switches obtained by dividing one switch into a plurality of switches and divided capacitors obtained by dividing one capacitor into a plurality of capacitors.

8. The discrete-time circuit according to claim 1, wherein
    the averaging processing circuit includes an operational amplifier that includes a plurality of divided inverting input terminals that is connected to capacitors included in the sampling circuits, respectively, in one-to-one correspondence, and a capacitor provided between the divided inverting input terminals and an output terminal of the operational amplifier is divided capacitors obtained by dividing one capacitor into a plurality of capacitors.

9. A discrete-time circuit that samples an inputted analog signal a plurality of number of times at different times respectively and averages results of a plurality of samplings, the discrete-time circuit comprising:
a plurality of sampling circuits that samples the analog signal by a plurality of sampling clocks of which sampling periods overlap with each other and which has a relationship in which end times of the sampling periods are different from each other, in a first half cycle in a sampling cycle that is same cycle as an operation control clock of the discrete-time circuit; and
an averaging processing circuit that performs average processing on each sampled value in the sampling circuits in response to a start of a period corresponding to a last half cycle of the sampling period in the operation control clock,
wherein a circuit that generates the sampling clocks includes any one of a series circuit and a parallel circuit of divided buffers obtained by dividing one buffer into a plurality of buffers, and
the sampling clocks are outputted from the divided buffers in one-to-one correspondence.

10. A discrete-time circuit that samples an inputted analog signal a plurality of number of times at different times respectively and averages results of a plurality of samplings, the discrete-time circuit comprising:
a plurality of sampling circuits that samples the analog signal by a plurality of sampling clocks of which sampling periods overlap with each other and which has a relationship in which end times of the sampling periods are different from each other, in a first half cycle in a sampling cycle that is same cycle as an operation control clock of the discrete-time circuit; and
an averaging processing circuit that performs average processing on each sampled value in the sampling circuits in response to a start of a period corresponding to a last half cycle of the sampling period in the operation control clock,
wherein the analog signal is an output signal from a digital-analog converter in which a sampling frequency is set to oversampling so that a conversion cycle is synchronized with an interval of sampling times of the sampling clocks.

11. A multi-stage cascaded system of discrete-time circuits in which the discrete-time circuits are cascaded in multiple stages, wherein a sampling circuit included in any one or a plurality of stages is composed of a discrete-time circuit that samples an inputted analog signal a plurality of number of times at different times respectively and averages results of a plurality of samplings, the discrete-time circuit comprising:
a plurality of sampling circuits that samples the analog signal by a plurality of sampling clocks of which sampling periods overlap with each other and which has a relationship in which end times of the sampling periods are different from each other, in a first half cycle in a sampling cycle that is same cycle as an operation control clock of the discrete-time circuit; and
an averaging processing circuit that performs average processing on each sampled value in the sampling circuits in response to a start of a period corresponding to a last half cycle of the sampling period in the operation control clock.

12. The multi-stage cascaded system of discrete-time circuits according to claim 11, wherein the stage is a stage in a delta sigma analog-digital converter.

13. The multi-stage cascaded system of discrete-time circuits according to claim 11, wherein the stage is a stage in a pipeline analog-digital converter.

14. The multi-stage cascaded system of discrete-time circuits according to claim 11, wherein the stage is a stage in a system in which switched capacitor filters are cascaded in multiple stages.

15. A semiconductor integrated circuit in which a digital-analog converter and a discrete-time circuit are arranged on a same semiconductor chip, wherein
the discrete-time circuit is composed of a discrete-time circuit that samples an inputted analog signal a plurality of number of times at different times respectively and averages results of a plurality of samplings, the discrete-time circuit comprising:
a plurality of sampling circuits that samples the analog signal by a plurality of sampling clocks of which sampling periods overlap with each other and which has a relationship in which end times of the sampling periods are different from each other, in a first half cycle in a sampling cycle that is same cycle as an operation control clock of the discrete-time circuit; and
an averaging processing circuit that performs average processing on each sampled value in the sampling circuits in response to a start of a period corresponding to a last half cycle of the sampling period in the operation control clock, and
the digital-analog converter is such that when outputting to the discrete-time circuit, a sampling frequency is set to oversampling so that a conversion cycle is synchronized with an interval of sampling times of the sampling clocks in the discrete-time circuit.

16. A signal processing system in which discrete-time circuits are cascaded in a rear stage of a digital-analog converter, wherein
the discrete-time circuit is composed of a discrete-time circuit that samples an inputted analog signal a plurality of number of times at different times respectively and averages results of a plurality of samplings, the discrete-time circuit comprising:
a plurality of sampling circuits that samples the analog signal by a plurality of sampling clocks of which sampling periods overlap with each other and which has a relationship in which end times of the sampling periods are different from each other, in a first half cycle in a sampling cycle that is same cycle as an operation control clock of the discrete-time circuit; and
an averaging processing circuit that performs average processing on each sampled value in the sampling circuits in response to a start of a period corresponding to a last half cycle of the sampling period in the operation control clock, and
the digital-analog converter is such that a sampling frequency is set to oversampling so that a conversion cycle is synchronized with an interval of sampling times of the sampling clocks in the discrete-time circuit.

17. The semiconductor integrated circuit according to claim 15, further comprising:
a first switch that switches connection of an output route of the digital-analog converter between a normal signal route and a measurement signal route in accordance with a present or absence of input of a self-test instruction; and
a second switch that switches connection of an input route of the discrete-time circuit between a normal signal route and a measurement signal route in accordance with a present or absence of input of the self-test instruction.

* * * * *